(12) United States Patent
Tsuchiya et al.

(10) Patent No.: US 7,038,233 B2
(45) Date of Patent: May 2, 2006

(54) SEMICONDUCTOR OPTICAL DEVICES AND OPTICAL MODULES

(75) Inventors: Tomonobu Tsuchiya, Hachioji (JP); Tsukuru Ohtoshi, Hanno (JP)

(73) Assignees: Hitachi, Ltd., Tokyo (JP); Opnext Japan, Inc., Kanagawa (JP)

( * ) Notice: Subject to any disclaimer, the term of this patent is extended or adjusted under 35 U.S.C. 154(b) by 107 days.

(21) Appl. No.: 10/782,897

(22) Filed: Feb. 23, 2004

(65) Prior Publication Data

US 2005/0127384 A1    Jun. 16, 2005

(30) Foreign Application Priority Data

Dec. 12, 2003    (JP) .............................. 2003-415251

(51) Int. Cl.
*H01L 29/06* (2006.01)
*H01L 31/328* (2006.01)
*H01L 31/336* (2006.01)
*H01L 31/72* (2006.01)
*H01L 31/109* (2006.01)

(52) U.S. Cl. .............................. 257/14; 257/9; 257/10; 257/11; 257/12; 257/13; 257/15; 257/16; 257/17; 257/18; 257/20; 257/21; 257/22; 257/23; 257/24; 257/25

(58) Field of Classification Search ............ 257/14–16, 257/18, 21–23, 9–13, 17, 20, 24–25

See application file for complete search history.

(56) References Cited

U.S. PATENT DOCUMENTS

| | | | | |
|---|---|---|---|---|
| 4,929,984 A | * | 5/1990 | Muto et al. .................. | 257/22 |
| 5,132,981 A | * | 7/1992 | Uomi et al. ............ | 372/45.012 |
| 5,253,265 A | * | 10/1993 | Seko et al. ............. | 372/46.016 |
| 5,753,933 A | * | 5/1998 | Morimoto ..................... | 257/22 |
| 5,929,462 A | * | 7/1999 | Kasukawa et al. ............ | 257/22 |
| 5,952,673 A | * | 9/1999 | Higashi et al. ................ | 257/18 |
| 6,150,667 A | * | 11/2000 | Ishizaka et al. ................ | 257/21 |
| 6,407,407 B1 | * | 6/2002 | Johnson et al. ................ | 257/18 |
| 6,853,015 B1 | * | 2/2005 | Tsuchiya ..................... | 257/185 |
| 6,911,713 B1 | * | 6/2005 | Ikeda et al. ................... | 257/21 |

(Continued)

FOREIGN PATENT DOCUMENTS

JP    10-84170    8/1997

OTHER PUBLICATIONS

R. Bhat et al, "High-Performance 1.3 µm AlGaInAs/InP Strained Quantum Well Lasers Grown by Organometallic Chemical Vapor Deposition", Journal of Crystal Growth (1004), pp. 858-865.

(Continued)

*Primary Examiner*—Ida M. Soward
(74) *Attorney, Agent, or Firm*—Reed Smith LLP; Stanley P. Fisher, Esq.; Juan Carlos A. Marquez, Esq.

(57) ABSTRACT

An InGaAlAs-based buried type laser is expected to improve properties of the device, but generates defects at a re-growth interface and is difficult to realize a long-term reliability necessary for optical communication, due to inclusion of Al in an active layer. A semiconductor optical device and an optical module including a package substrate and a semiconductor optical device mounted on the package substrate are provided, whereby there are realized the improvement of device properties and the long-term reliability through the use of an Al composition ratio-reduced tensile strained quantum well layer.

14 Claims, 8 Drawing Sheets

U.S. PATENT DOCUMENTS

2002/0118713 A1* 8/2002 Shirai et al. .................. 372/34
2003/0123816 A1* 7/2003 Steinberg et al .............. 385/92
2005/0078904 A1* 4/2005 Sato et al. .................... 385/14
2005/0141578 A1* 6/2005 Reid et al. .................... 372/45

OTHER PUBLICATIONS

P.J.A. Thijs et al., "High Performance Buried Heterostructure λ=1.5 μm InGaAs/AlGaInAs Strained-Layer Quantum Well Laser Diodes", 10th International Conference on Indium Phosphide and Related Materials (1996) ThA2-2, pp. 765-768.

Tawee Tanbun-Ek et al., "High Performance Buried Heterostructure 1.55 μm Wavelength AlGaInAs/InP Multiple Quantum Well Lasers Grown Entirely by NOVPE Technique", 10th International Conference on Indium Phosphide and Related Materials (May 1998) ThP-48, pp. 702-705.

C. E. Zah et al., "High-Temperture Modulation Dynamics of 1.3 μm $Al_xGa_y In_{1-x-y}As$/InP Compressive-Strained Multiple-Quantum-Well Lasers", 14th International Semiconductor Laser Conference (1994), TH 1.3, pp. 215-216.

* cited by examiner

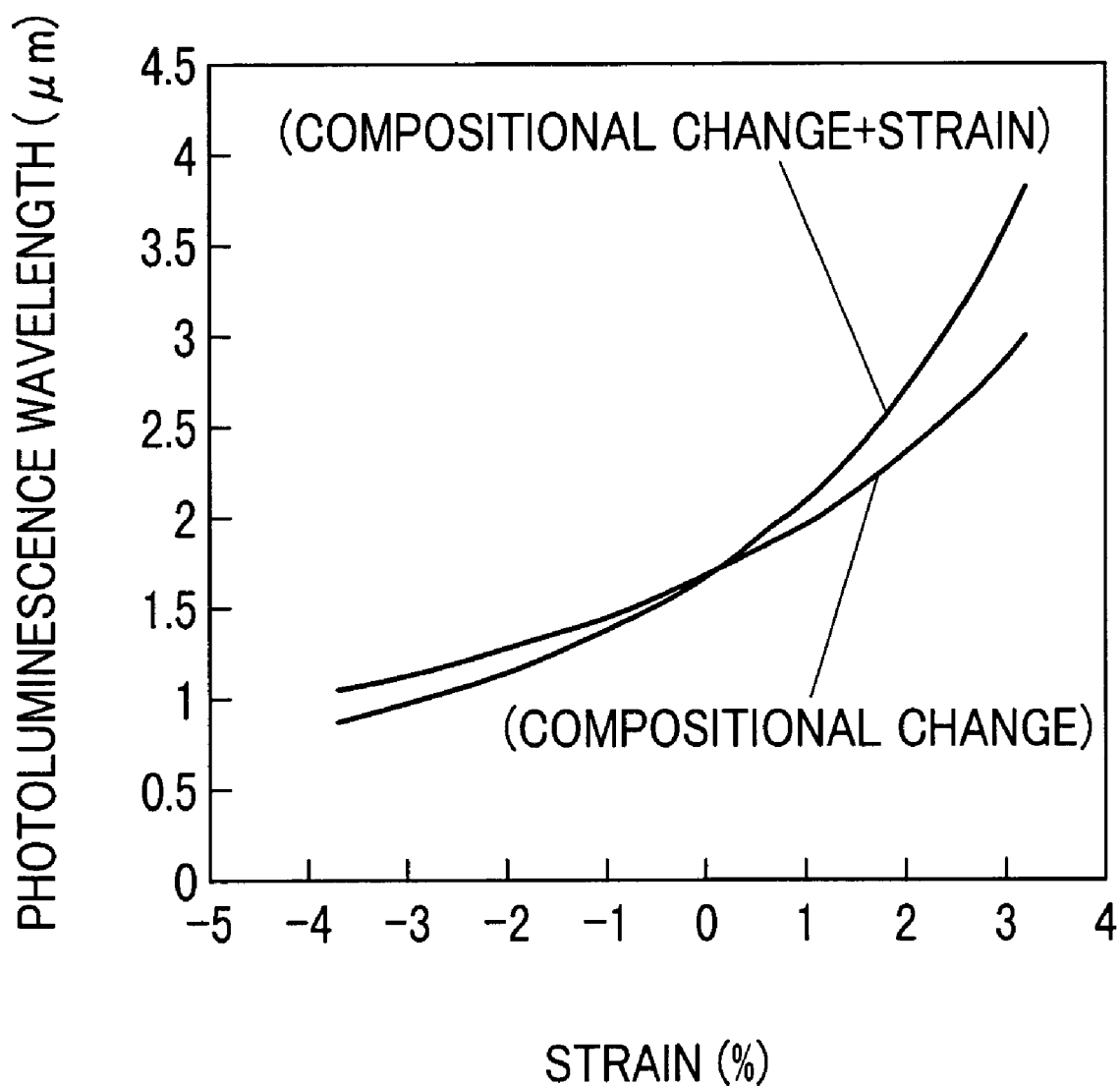

A(In: 0.87,Ga: 0,Al: 0.13)
B(In: 1.0,Ga: 0,Al: 0)
C(In: 0,Ga: 1.0,Al: 0)
D(In: 0,Ga: 0.87,Al: 0.13)
E(In: 0.52,Ga: 0,Al: 0.48)
F(In: 0.53,Ga: 0.47,Al: 0)
G(In: 0,Ga: 0,Al: 1.0)
H(In: 0.53,Ga: 0.34,Al: 0.13)
I(In: 0.53,Ga: 0.4,Al: 0.07)
J(In: 0.4,Ga: 0.6,Al: 0)
K(In: 0.26,Ga: 0.74,Al: 0)
L(In: 0.46,Ga: 0.41,Al: 0.13)
M(In: 0.38,Ga: 0.58,Al: 0.04)
N(In: 0.64,Ga: 0.18,Al: 0.18)

O(In: 0.76,Ga: 0.11,Al: 0.13)
P(In: 0.5,Ga: 0.5,Al: 0)
Q(In: 0.34,Ga: 0.66,Al: 0)
R(In: 0.55,Ga: 0.32,Al: 0.13)
S(In: 0.6,Ga: 0.34,Al: 0.06)
T(In: 0.49,Ga: 0.45,Al: 0.06)
U(In: 0.73,Ga: 0.08,Al: 0.19)
V(In: 0.46,Ga: 0.35,Al: 0.19)

SEMICONDUCTOR OPTICAL DEVICES AND OPTICAL MODULES

BACKGROUND OF THE INVENTION

The present invention relates to semiconductor optical devices suitable for use in optical communication and to an active region thereof.

Studies have been pursued which change the materials of the multiple-quantum well active layer from the semiconductor materials of InGaAsP-based compounds to the semiconductor materials of InGaAlAs-based compounds to improve high-temperature, high-speed properties in semiconductor lasers for optical communication. This is because the InGaAlAs-based compounds are band-structurally stronger in the confinement of electrons and is little in the degradation of laser properties at high temperatures. On the other hand, in the InGaAlAs-based compounds the crystal surface of the Al-containing layer is subject to oxidation, and so when both sides of the mesa-like active region are buried, defects are generated at the regrowth interface thereof. As a result, although there are the buried structure and the ridge structure as semiconductor laser structures, many InGaAlAs-based semiconductor lasers utilize the ridge type, which does not need the regrowth interface. Examples of InGaAlAs-based lasers include a laser in which the active layer structure uses compressive strain described in claim 1 and FIG. 3 of Japanese Patent Laid-Open No. 10-84170 (patent document 1) and a laser described in Journal of Crystal Growth 145 pp. 858–868, 1994 (non-patent document 1). An example of InGaAlAs-based buried type lasers is one in IPRM 96 ThA2-2 p. 765, 1996 (Intern. Conf. on Indium Phosphide and Related Material; non-patent document 2). In addition, studies of interface treatment in InGaAlAs-based buried type lasers includes a study on sulfur treatment with $NH_4S$; for example, it is known in IPRM98 ThP-48 p. 702, 1998 (Intern. Conf. on Indium Phosphide and Related Material; non-patent document 3). Furthermore, with examples according to lasing wavelengths using compressive strain, for example, there are reported an InGaAs quantum well layer (non-patent document 2) and an InGaAlAs quantum well layer (non-patent document 3), for a 1.55 µm band, and $In_{0.673}Ga_{0.157}Al_{0.17}As$ to $In_{0.75}Ga_{0.106}Al_{0.143}As$, etc. for a 1.3 µm band in The 14th International Semiconductor Laser Conference (TH 1.3 p-215, 1994; non-patent document 4).

SUMMARY OF THE INVENTION

Comparison between the ridge type and the buried type in the prior art described above shows that the buried type is more outstanding for making the low threshold current and the high speed modulation due to being capable of current constriction in the lateral direction. Therefore, many buried type structures of InGaAsP-based semiconductor laser devices are utilized because of not causing problems of the regrowth interface oxidation. On the other hand, InGaAlAs-based semiconductor laser devices containing Al(aluminium) in the active layer cause defects to take place at the regrowth interface due to the oxidation of the surface layer containing Al. Although methods for reducing defects on account of the oxidized film include sulfur treatment of the prior art described above, long-term reliability, which is required for optical communication, has not been realized yet.

In the background like such art, the object of the present invention is to provide a InGaAlAs-based semiconductor laser device capable of attainment of long-term reliability, while satisfying specified lasing wavelength band ranges. In this case, the lasing wavelength bands stand for a 1.3 µm band and a band of 1.36 to 1.49 µm. This kind of semiconductor laser device is suited for sources for optical communication or pumping sources for Raman amplifier and fiber amplifier. In addition, technically, the defects at the regrowth interface of the buried type semiconductor layer need to be reduced. This makes it possible to provide an InGaAlAs-based buried type structure having long-term reliability.

The main points of the present invention are in the following.

(1) A first mode of the present invention is a semiconductor optical device, comprising: an InP substrate; an active region formed above the InP substrate, said active region being comprised of a quantum well structure; optical guiding layers each formed on and under said active region; and clad layers; wherein on sides in the direction crossing the light-emitting direction, the sides of the active region are buried with semiconductor layers having band gap energy greater than that of a quantum well layer; and wherein a composition of Al of the quantum well layer includes at least one selected from the group consisting of InGaAlAs compound semiconductor layers, a composition ratio of the Al being in the range of 0 to 0.13, both inclusive.

Further, the InP substrate used in this specification includes a buffer layer formed on the so-called InP substrate for crystal growth for improving crystal properties or an InP compound semiconductor layer playing a role as the InP clad layer of the lower portion of the active layer.

(2) A second mode of the present invention is the semiconductor optical device described in (1) above, wherein a composition ratio of Al of the quantum well layer is in the range of 0.01 to 0.1, both inclusive.

(3) A third mode of the present invention is a semiconductor optical device described in (1) above, wherein the InGaAlAs is at least one selected from the group consisting of compositions A (In: 0.87, Ga: 0, Al: 0.13), B (In: 1.0, Ga: 0, Al: 0), C (In: 0, Ga: 1.0, Al: 0), and D (In: 0, Ga: 0.87, Al: 0.13) in the composition diagram of the four-element based compound semiconductor materials ($In_{1-x-y}Ga_xAl_yAs$).

The semiconductor layer placed on the side of the multilayer in the direction crossing the light-emitting direction is called the so-called buried layer. To adopt a variety of variations to prevent leak current via a buried layer by placing a pn junction within the semiconductor layer is free in accordance with the demand of properties. In addition, the multilayer of the at least the active region and the upper clad layer can also form an embodiment comprising a multilayer also including the lower clad layer of the substrate side with respect to the active region or a portion of the clad layer.

The most fundamental embodiments of the present invention have been described. In a semiconductor laser device with a lasing wavelength of a 1.3 µm band, no examples are so far present which use an embodiment having tensile strain in order to reduce Al of the quantum well layer of the active region as in the case of the present invention. Realization of the embodiment have enabled the oxidation decrease of a regrowth interface through the use of an InGaAlAs layer for a quantum well layer and in a small Al composition ratio. Because the surface oxidation is in a small state, a high quality buried-type compound semiconductor multilayer can be realized. Therefore, the long-term reliability of a semiconductor optical device can be secured.

Additionally, various main embodiments of the invention will be set forth.

(4) A fourth mode of the present invention is a semiconductor optical device, comprising: an InP substrate; an active region formed above the InP substrate, said active region being comprised of a quantum well structure; optical guiding layers each formed on and under said active region; and clad layers; wherein on sides in the direction crossing the light-emitting direction, the sides of the active region are buried with semiconductor layers having band gap energy greater than that of a quantum well layer; and wherein the quantum well layer has tensile strain.

For a specific composition example of the quantum well layer, the composition $(In_{1-x-y}Ga_xAl_yAs)$ of the quantum well layer includes at least one selected from the group consisting of compositions E (In: 0.52, Ga: 0, Al: 0.48), F (In: 0.53, Ga: 0.47, Al: 0), C (In: 0, Ga: 1.0, Al: 0), and G (In: 0, Ga: 0, Al: 1.0) in the composition diagram of the four-element based compound semiconductor materials.

(5) A fifth mode of the present invention is the semiconductor optical device described in (1) above, wherein the InGaAlAs layer has tensile strain.

With a specific composition example, the InGaAlAs includes at least one selected from the group consisting of compositions H (In: 0.53, Ga: 0.34, Al: 0.13), F (In: 0.53, Ga: 0.47, Al: 0), C (In: 0, Ga: 1.0, Al: 0), and D (In: 0, Ga: 0.87, Al: 0.13) in the composition diagram of the four-element based compound semiconductor materials $(In_{1-x-y}Ga_xAl_yAs)$.

(6) A sixth mode of the present invention is the semiconductor optical device described in (5) above, wherein the photoluminescence wavelength from the active region is within the range of 1.25 μm to 1.35 μm.

(7) A seventh mode of the present invention is the semiconductor optical device described in (5) above; wherein the InGaAlAs layer includes at least one selected from the group consisting of compositions H (In: 0.53, Ga: 0.34, Al: 0.13), I (In: 0.53, Ga: 0.4, Al: 0.07), J (In: 0.4, Ga: 0.6, Al: 0), K (In: 0.26, Ga: 0.74, Al: 0) and L (In: 0.46, Ga: 0.41, Al: 0.13) in the composition diagram of the four-element based compound semiconductor materials $(In_{1-x-y}Ga_xAl_yAs)$; and has tensile strain.

(8) An eighth mode of the present invention is the semiconductor optical device described in (5) above, wherein the photoluminescence wavelength from the active region is within the range of 1.25 μm to 1.35 μm, and wherein the InGaAlAs layer includes at least one selected from the group consisting of compositions H (In: 0.53, Ga: 0.34, Al: 0.13), I (In: 0.53, Ga: 0.4, Al: 0.07), J (In: 0.4, Ga: 0.6, Al: 0), K (In: 0.26, Ga: 0.74, Al: 0) and L (In: 0.46, Ga: 0.41, Al: 0.13) in the composition diagram of the four-element based compound semiconductor materials $(In_{1-x-y}Ga_xAl_yAs)$.

(9) A ninth mode of the present invention is the semiconductor optical device described in (6) above, wherein a barrier layer constituting the active region is p-type doped.

(10) A 10th mode of the present invention is the semiconductor optical device described in (7) above, wherein a barrier layer constituting the active region is p-type doped.

(11) An 11th mode of the present invention is the semiconductor optical device described in (8) above, wherein a barrier layer constituting the active region is p-type doped.

(12) A 12th mode of the present invention is the semiconductor optical device described in (1) above, wherein the photoluminescence wavelength from the active region is within the range of 1.36 μm to 1.49 μm.

(13) A 13th mode of the present invention is the semiconductor optical device described in (1) above, wherein the InGaAlAs layer includes at least one selected from the group consisting of compositions O (In: 0.76, Ga: 0.11, Al: 0.13), P (In: 0.5, Ga: 0.5, Al: 0), Q (In: 0.34, Ga: 0.66, Al: 0), and R (In: 0.55, Ga: 0.32, Al: 0.13) in the composition diagram of the four-element based compound semiconductor materials $(In_{1-x-y}Ga_xAl_yAs)$.

(14) A 14th mode of the present invention is the semiconductor optical device described in (1) above, wherein the InGaAlAs layer includes at least one selected from the group consisting of compositions O (In: 0.76, Ga: 0.11, Al: 0.13), P (In: 0.5, Ga: 0.5, Al: 0), Q (In: 0.34, Ga: 0.66, Al: 0), and R (In: 0.55, Ga: 0.32, Al: 0.13) in the composition diagram of the four-element based compound semiconductor materials $(In_{1-x-y}Ga_xAl_yAs)$, and wherein the photoluminescence wavelength from the active region is within the range of 1.36 μm to 1.49 μm.

(15) A 15th mode of the present invention is the semiconductor optical device described in (12) above, wherein a barrier layer constituting the active region is p-type doped.

(16) A 16th mode of the present invention is the semiconductor optical device described in (13) above, wherein a barrier layer constituting the active region is p-type doped.

(17) A 17th mode of the present invention is the semiconductor optical device described in (14) above, wherein a barrier layer constituting the active region is p-type doped.

(18) An 18th mode of the present invention is an optical module for a transmitting light source mounting a variety of the semiconductor optical devices described thus far. In this optical module, the sealing structure thereof is of non-hermitic sealing, and can sufficiently secure the properties without mounting a temperature controller within the module.

The present invention provides semiconductor optical devices such as optical modulations and optical switches of the wavelength ranges, and modules using the semiconductor optical devices thereof as well, in addition to semiconductor laser devices.

In InGaAlAs-based semiconductor laser devices, the present invention can secure long-term reliability while ensuring the specified lasing wavelength band regions. In this way, the present invention can provide buried type InGaAlAs-based semiconductor laser devices satisfying both the lasing wavelength band regions and long-term reliability.

BRIEF DESCRIPTION OF THE DRAWINGS

FIG. 4B shows an example of the relationship between the amount of strain and the photoluminescence wavelength in InGaAs;

DETAILED DESCRIPTION OF THE PREFERRED EMBODIMENTS

Prior to explaining the specific embodiments, experimental facts attesting the present invention will be set forth.

Figure 1:
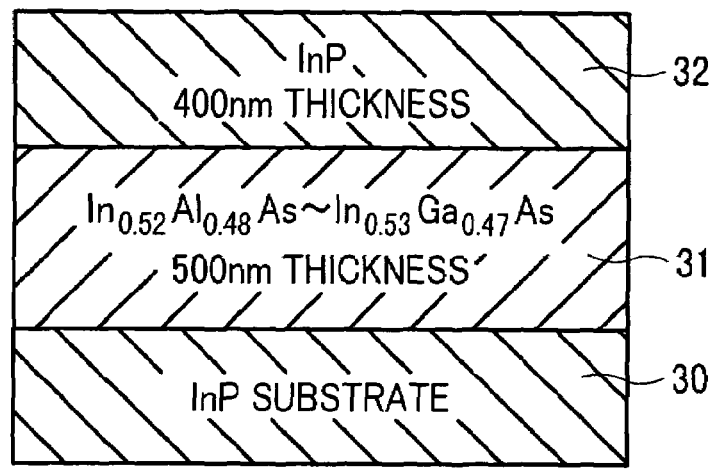
FIG. 1 is a sectional view of a sample structure for regrowth studies.

Firstly, studies from the viewpoint of crystal properties during crystal growth and the observation of morphology have been carried out. In other words, in InGaAlAs-based alloy crystals on InP substrates, the crystal compositions of layers containing Al and crystal properties of regrowth layers were systematically investigated. FIG. 1 shows the structure of samples and Table 1 summarizes surface morphologies.

TABLE 1

| Composition | Surface Morphology |
| --- | --- |
| $In_{0.52}Al_{0.48}As$ | milky (polycrystal) |
| $In_{0.52}Ga_{0.24}Al_{0.24}As$ | cross hatching |
| $In_{0.52}Ga_{0.36}Al_{0.12}As$ | mirror surface |
| $In_{0.53}Ga_{0.47}As$ | mirror surface |

In the studies, a layer 31, such as an $In_{1-x-y}Ga_xAl_yAs$ layer, was allowed to grow on an InP substrate 30. Then, after the same treatment as that prior to a buried growth in a buried type semiconductor laser device was conducted, the thickness of an InP layer 32 was allowed to grow to 400 mm. The $In_{0.52}Al_{0.48}As$ surface having a large Al composition was milky, while $In_{0.52}Ga_{0.36}Al_{10.12}As$ and $In_{0.53}Ga_{0.47}As$, having small Al compositions, provided mirror surfaces. In addition, the $In_{0.52}Ga0.24Al0.24As$ surface having Al composition ratios of near 0.24 showed decreased milkiness and generated cross hatching, and therefore defects at the regrowth interfaces remained yet. These results were summarized in Table 1. The surface morphology tends to be a mirror surface with decreasing Al composition ratio. More specifically, a mirror surface similar to those observed in InP and InGaAs was obtained in a Al composition ratio of 0.13 or less. Furthermore, an observation under a transmission electron microscope revealed that there were no defects of the regrowth layer if a Al composition ratio of 0.13 or less is set.

Figure 2:
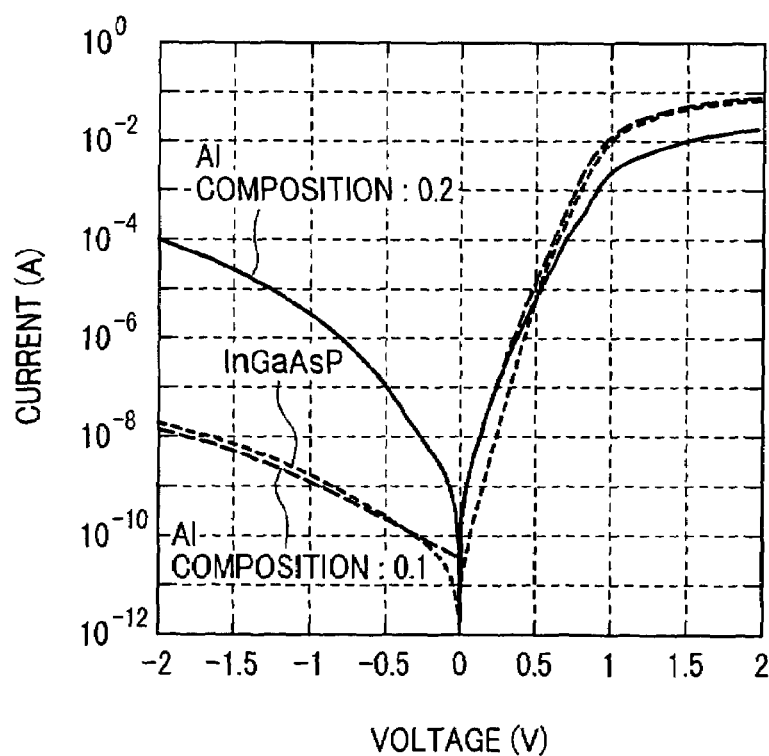
FIG. 2 shows the relationship between a small current and a voltage in an optical semiconductor device.

Secondly, the results of buried type semiconductor laser devices will be discussed. In buried type semiconductor laser devices, the relationship between the Al composition ratio and device properties was studied. FIG. 2 shows the relationship between a small current and the voltage when the Al composition ratio was varied. In FIG. 2, the abscissa axis shows an impressed voltage when a reverse bias was applied to a semiconductor laser device, and the ordinate axis indicates a current. When the Al composition ratio of a quantum well layer (InGaAlAs layer) was 0.2, the leak current was large if a reverse bias was applied. On the other hand, when the Al composition ratio was 0.1, the leak current at the interface was small, with the value being equivalent to that of an InGaAsP-based buried type laser.

In the reliability of a device as well, when the Al composition ratio was 0.1, a long-term reliability of about 100,000 hours, which is required in optical communication, was realized, while a long-term reliability was within ten thousands hours when the Al composition ratio was 0.2.

The results above shows that the oxidation of the surface layer is decreased and defects of the regrowth interface is reduced, with decreasing Al composition ratio. Further, the result of detailed studies has indicated that the Al composition ratio needs to be 0.13 or less in order to obtain a high quality interface equivalent to that of the InGaAsP system, or to realize a long-term reliability required for optical communication. The examples thereof will be set forth in embodiments below.

On the other hand, the lasing wavelengths of a transmitting source in a semiconductor laser for optical communication are a 1.3 μm band and a 1.55 μm band. $In_{1-x-y}Ga_xAl_yAs$ is lattice-matched by causing the In composition ratio to be from 0.52 to 0.53 ($In_{0.53}Ga_{0.47}As$ and $In_{0.52}Al_{0.48}As$ being lattice-matched on the InP substrate). The wave length control is possible by changing the composition ratios of Al and Ga, with the In composition ratio being fixed at from 0.52 to 0.53. As a result, the wavelength is long in the region of the large Al composition ratio, while the wavelength is short in the region of the small Al composition ratio. In addition, if the In composition ratio is large, the lattice constant is large and the band gap wavelength is long, and so the quantum well layer is compression-strained. When the In composition ratio is small, the lattice constant is small and the band gap wavelength is short, so that tensile strain is applied to the quantum well layer. Furthermore, for the relationship between the strain of the quantum well layer and device properties, it is reported that the introduction of strain leads to the improvement of properties as compared to no strain case. Many compressive strains are reported as the strain. Examples of compositions include the InGaAs quantum well layer for the 1.55 μm band (non-patent document 2), and $In_{0.673}Ga_{0.157}Al_{0.17}As$ to $In_{0.751}Ga_{0.106}Al_{0.143}As$ for the 1.3 μm band compressive strain (non-patent document 4). In general, the 1.3 μm band has a short wavelength relative to the 1.5 μm band, and so the Al composition ratio thereof is large. Accordingly, when a buried type semiconductor laser in the 1.3 μm band is produced, the realization of a buried type semiconductor laser having a long-term reliability is difficult due to the Al composition ratio being large.

Taking into account the matter described above, in the present invention, the Al composition ratios of InGaAlAs-based strained quantun well layers photoluminescent in the 1.3 μm band were tried to be reduced. Specifically, regarding the surface morphology of the Al composition ratio during regrowth thereof as the mirror surface composition ratio (refer to Table 1), strained quantum well layers photoluminescent near 1.3 μm were produced by decreasing the In composition ratio and increasing the Ga composition ratio. In addition, with photoluminescence in the 1.3 μm band, it is generally possible that the Al composition ratio is increased, but in this case since long-term reliability is not obtained, the In composition ratio was decreased and the Ga composition ratio was increased.

Figure 3:
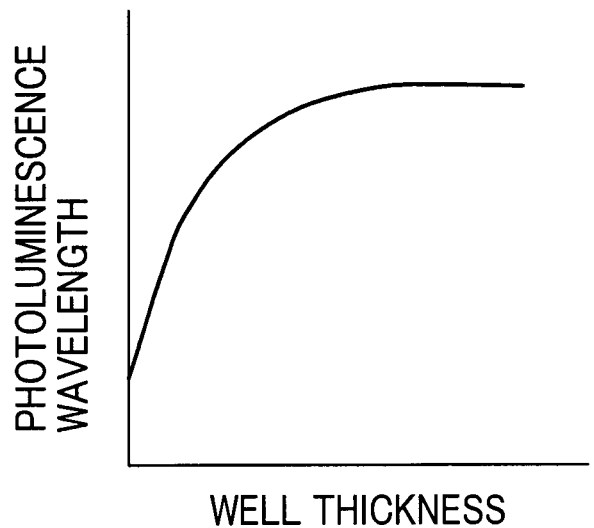
FIG. 3 shows the relationship between the thickness of a quantum well layer and the photoluminescence wavelength in the quantum well structure.
Figure 4A:
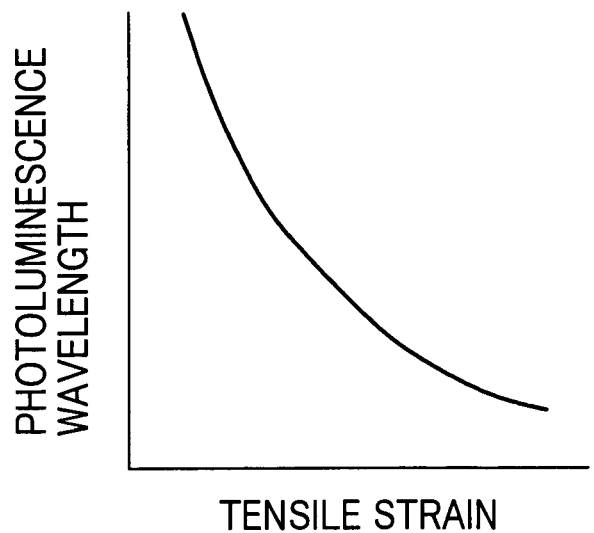
FIG. 4A shows the relationship between the band gap wavelength and the amount of strain.

Furthermore, an increase of the Ga composition ratio adds tensile strain to the quantum well layer, thereby leading to the changes of laser device properties and the photoluminescence wavelength. The photoluminescence wavelength depends on the band gap wavelength of the well layer and thickness of the well layer, and the band gap wavelength of the well layer depends on the band gap wavelength due to the alloy crystal composition of the well layer and on a wavelength change caused by the amount of strain. FIG. 3 shows a general relationship between the thickness of a quantum well layer and the photoluminescence wavelength change, in the multiple-quantum well structure. The abscissa axis indicates the thickness of the quantum well layer and the ordinate axis indicates the photoluminescence wavelength. FIG. 4A shows the relationship between the band gap wavelength and the amount of strain. FIG. 4B shows the wavelength change, considering and without considering the amount of strain in InGaAs. Both cases are indicated by the (compositional change+strain stress) and the (compositional change). When Ga is added to InGaAlAs, the composition wavelength (no strain) is shortened, and the tensile strain due to Ga is added, so that the wavelength is slightly longer as the effect of the strain, totally resulting in a decrease in the wavelength. The photoluminescence wavelength of an actual multiple-quantum well structure comes to be determined. Additionally, the thickness of the well layer is generally from 3 nm to 10 nm, more preferably from about 4 nm to about 8 nm. The percentage of strain is generally from 0 inclusive to −1.9%, more preferably from about −0.8% to about −1.5%. Adjustment of these various parameters provides the 1.3 μm band of lasing wavelengths from 1.25 μm to 1.35 μm. Furthermore, an amount of strain of about −0.2% is considered to be sufficient for the effect of the present invention.

In the 1.36 to 1.49 μm bands as well, the thickness of the well layer is generally on the order of that of the 1.3 μm band. The amount of strain is available also in the case of the compression, which has a small Al composition ratio, due to a long wavelength.

Studies were carried out on device properties caused by tensile strain and the composition ranges of the no-defect 1.3 μm band $In_{1-x-y}Ga_xAl_yAs$ system quantum well layers. Table 2 indicates compressive strains, tensile strains, threshold current values without strain and a range of the Al composition ratios capable of photoluminescence in the 1.3 μm band in the InGaAlAs-based ridge stripe type laser device of the 1.3 μm band.

TABLE 2

| Amount of strain | Threshold current value | Al composition ratio | |
|---|---|---|---|
| −1.20% | 7 mA | 0.06 | the present invention |
| 0% | 12 mA | 0.11 | comparative example |
| +1.2% | 7 mA | 0.21 | Comparative example |

The Al composition ratio without strain is as small as 0.11, and the threshold current value is large. In the tensile strain (−1.2%), a ridge stripe type laser device with a small threshold current value and without generation of the regrowth interface was obtained. On the other hand, in the compressive strain (+1.2%) the threshold current value becomes small, and the Al composition ratio is large, thereby posing a problem in long-term reliability. The results above show that the device properties without strain are worst, that the device properties are improved due to the effects of strains in both tension and compression, and that even the compression in a large Al composition ratio makes it difficult to realize a high reliable buried type laser.

Figure 5:
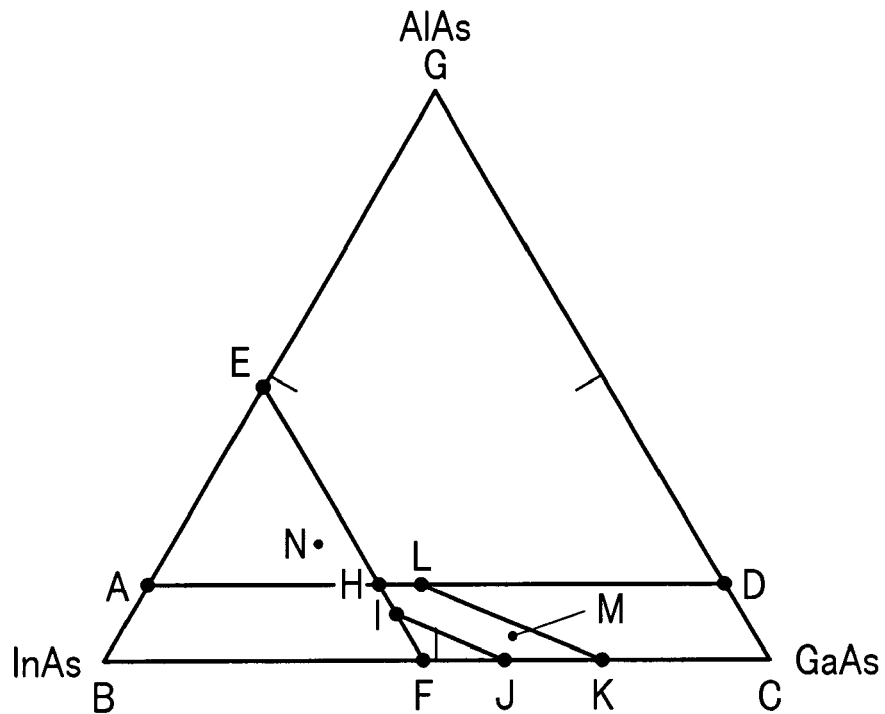
FIG. 5 is an InGaAlAs composition diagram indicating a range used for performing the present invention in the lasing wavelength 1.3 μm band.

FIG. 5 indicates a composition range having an Al composition ratio of 0.13 or less, a composition range of tensile strain, a composition range of tensile strain with a Al composition ratio of 0.13 or less, and a composition range having an Al composition ratio of 0.13 or less and capable of photoluminescence near 1.3 μm (1.25 to 1.35 μm) in the case of tensile strain, the composition ranges being used for $In_{1-x-y}Ga_xAl_yAs$ well layers. In FIG. 5, when the composition ratios ($In_{1-x-y}Ga_xAl_yAs$) of InGaAlAs quantum well layers are within the range of H (In: 0.53, Ga: 0.34, Al: 0.13), I (In: 0.53, Ga: 0.40, Al: 0.07), J (In: 0.4, Ga: 0.6, Al: 0), K (In: 0.26, Ga: 0.74, Al: 0), and L (In: 0.4, Ga: 0.41, Al: 0.13), photoluminescence near 1.3 μm is possible without deteriorating the reliability and properties of a device. In addition, in the region of the right side of the line connecting point L and point K, the wavelength is shorter than required. By contrast, in the region of the left side of the line connecting point H, point I and point J, the wavelength is longer than required. In the region of the upper side of the line connecting point H and point L, the Al composition ratio is large, so that the long-term reliability lacks.

In the composition diagram of FIG. 5, point M (In: 0.38, Ga: 0.58, Al: 0.04) is an example within the region described above. The semiconductor of the sample secures the specified wavelength range and indicates sufficient stability of long-term properties. On the other hand, point N (In: 0.64, Ga: 0.18, Al: 0.18) is values in a comparative Example, and has a large amount of Al, thereby exhibiting a disadvantage in long-term stability.

Figure 6:
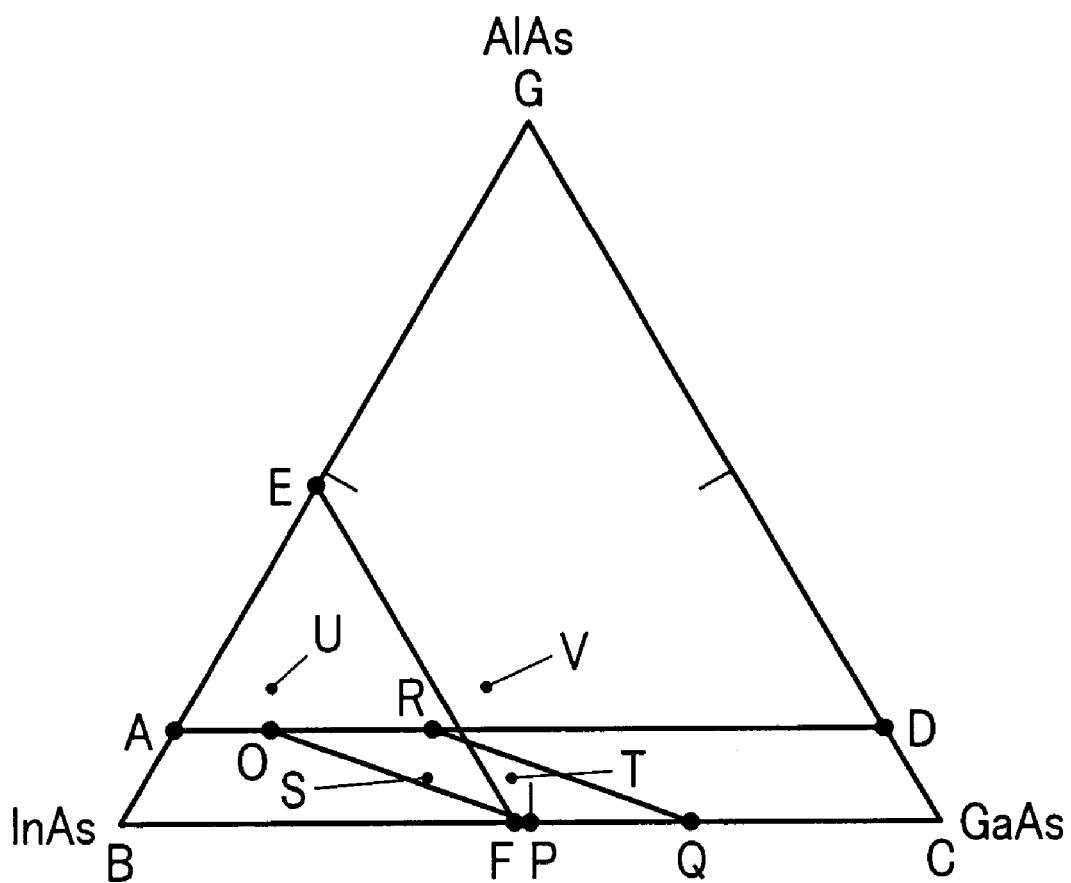
FIG. 6 is a InGaAlAs composition diagram that indicates a region used for realizing the present invention in the lasing wavelength 1.36 to 1.49 μm bands.

Next, the wavelength band region having photoluminescence wavelengths of 1.36 μm to 1.49 μm will be described. FIG. 6 is a composition diagram that indicates a region for realizing the 1.36 to 1.49 μm bands. It is important for the composition ratios ($In_{1-x-y}Ga_xAl_yAs$) of InGaAlAs quantum well layers to be within the range of O (In: 0.76, Ga: 0.11, Al: 0.13), P (In: 0.5, Ga: 0.5, Al: 0), Q (In: 0.34, Ga: 0.66, Al: 0), and R (In: 0.55, Ga: 0.32, Al: 0.13). For the wavelength band as well, in the region of the right side of the line connecting point R and point Q, the wavelength is shorter than required. In addition, in the region of the left side of the line connecting point O and point P, inversely, the wavelength is longer than required. In the region of the upper side of the line connecting point O and point P, the Al composition ratio is large, so that the long-term reliability lacks.

In the composition diagram of FIG. 6, point S (In: 0.6, Ga: 0.34, Al: 0.06) and point T (In: 0.49, Ga: 0.45, Al: 0.06) are examples within the region described above. The semiconductors of the samples secure the specified wavelength range and indicate sufficient stability of long-term properties. On the other hand, point U (In: 0.73, Ga: 0.08, Al: 0.19) and point V (In: 0.46, Ga: 0.35, Al: 0.19) are values in comparative Examples, and have large amounts of Al, thereby exhibiting a disadvantage in long-term stability.

Thus far, the devices have been set forth in accordance with the most basic structure of the present invention. Other various members constituting a semiconductor optical device are sufficiently considered to be the same as various technologies in typical semiconductor optical devices. The InP substrate itself or compound semiconductor layers different from the InP substrate, such as layers forming the InAlAs layer can be used for the clad layer of the InP substrate side relative to the active region. In addition, between the active region and the clad layer, an optical guide layer for the so-called optical confinement, having an intermediate refractive index of both regions thereof, is practically used as well.

Figure 7:
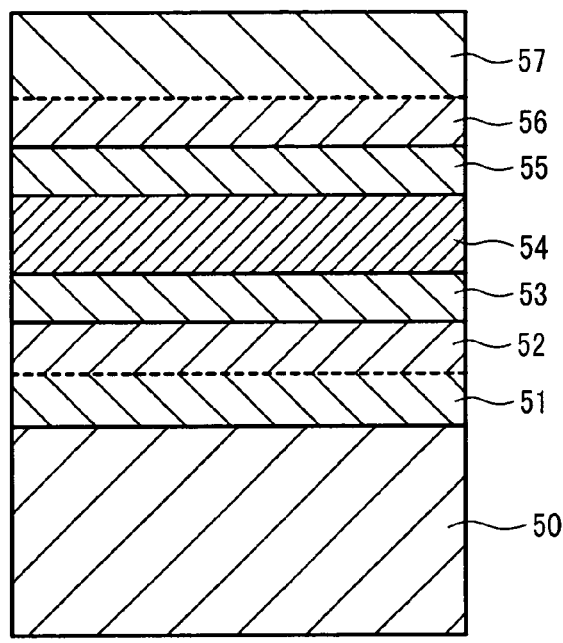
FIG. 7 is a sectional view indicating a model of a semiconductor multilayer of the present invention.

Referring to FIG. 7, construction examples of semiconductor multilayer containing an active region of the present invention will be set forth specifically. A semiconductor optical device of the present invention has at least an active region 54 and an upper clad layer over the active region, above an InP substrate 50. The active region 54, as described so far, has a quantum well structure. The quantum well layer uses an InGaAlAs layer in association with the selection of a photoluminescence wavelength. The detail of the composition selection thereof is as described previously. A barrier layer generally uses an InGaAlAs layer. The thicknesses of the well layer and the barrier layer are similar to that of a typical quantum well structure. In general, the thickness of the well layer is from about 4 nm to about 8 nm, and the thickness of the barrier layer is from about 5 nm to about 10 nm. So-called optical guide layers 53, 55 are practically inserted between the active region 54 and the region of both clad layers (51, 52, and 56, 57). The optical guide layer utilizes InGaAlAs, InGaAsP, or the like. The optical guide layer is selected such that the refractive index thereof relative to lasing light is larger than that of the clad layer and smaller than that of the active region. The thickness of the optical guide layer is from about 20 nm to about 0.2 μm. As a matter of course, according to the properties required, the optical guide layer can be removed. A further general improving approach relating to this optical confinement is sometimes applied. The description so far is about an example in which laser resonance is conducted by means of a Fabry-Perot resonator, and other resonators such as a DFB type (Distributed Feedback) is surely used as well. In this case, to prevent surface oxidation of a layer containing Al, for the optical guide layer the InGaAsP layer is used and at the interface of the latter layer and another layer a diffraction grating is practically formed.

The clad layer of the upper portion consists of one layer, or sometimes consists of a plurality of layers. A typical example of the device includes the optical guide layer 55, a first clad layer 56 such as an InAlAs layer on the upper part of the guide layer, and further the clad layer 57 made of an InP layer on the clad layer 56. With the clad layer on the substrate side, the InP substrate itself can perform the function of the clad layer. Therefore, a typical example is constructed by subjecting the InP layer to epitaxial growth on the InP substrate, the layer InP being a first substrate side clad layer, and placing thereon a second clad layer 52 on the substrate side, including the InAlAs layer.

EXAMPLE 1

Figure 8:
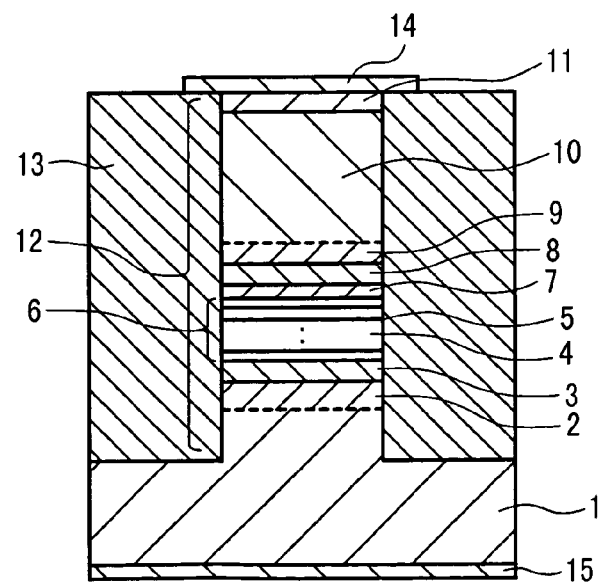
FIG. 8 is a sectional view in a face where a semiconductor laser device of a first example of the present invention and the advancing direction of laser light are intersected.

FIG. 8 is a sectional view in a face where a buried type semiconductor laser device with the 1.3 μm band of the present invention and the advancing direction of laser light are intersected. By means of a metalorganic vapor phase epitaxy method, an n-InP buffer layer 2 (Si concentration: $1\times10^{18}$ cm$^{-3}$, film thickness: 500 nm) and an n-$In_{0.52}Ga_{0.08}Al_{0.40}As$ guide layer 3 (film thickness: 80 nm, lattice-matched with an InP substrate, wavelength: 920 nm, Si concentration: $1\times10^{18}$ cm$^{-3}$) were grown on an n-InP substrate 1. Then a strained quantum well structure 6 (9 periods), an undoped $In_{0.52}Ga_{0.08}Al_{0.40}As$ guide layer 7 (film thickness: 80 nm, lattice-matched with the InP substrate, wavelength: 920 nm), a p-$In_{0.52}Al_{0.48}As$ clad layer 8 (film thickness: 100 nm, lattice-matched with the InP substrate, Zn concentration: $2\times10^{17}$ cm$^{-3}$), a p-InP clad layer 9 (film thickness: 200 nm, Zn concentration: $2\times10^{17}$ cm$^{-3}$), a p-InP clad layer 10 (film thickness: 1500 nm, Zn concentration: $8\times10^{17}$ cm$^{-3}$), and a p-InGaAs contact layer 11 (film thickness: 200 nm, lattice-matched with the InP substrate, Zn concentration: $2\times10^{19}$ cm$^{-3}$) were in order grown. In addition, the strained quantum well structure 6 is comprised of an undoped $In_{0.38}Ga_{0.56}Al_{0.06}As$ strained quantum well 4 (amount of strain: −1.0%, film thickness: 8 nm), and an undoped $In_{0.52}Ga_{0.16}Al_{0.32}As$ barrier layer 5 (film thickness: 10 nm, lattice-matched with the InP substrate, wavelength: 1000 nm).

Subsequently, a mesa-stripe 12 was formed by dry etching or wet etching. The side face spaces of the mesa-stripe was buried with a Fe-doped InP high-resistant layer 13 (Fe concentration: $2\times10^{17}$ cm$^{-3}$). Furthermore, a p-side electrode 14 and an n-side electrode 15 were placed to yield a laser structure.

As the effects of the present invention, the threshold current value of the resultant laser was capable of being reduced by about 20% and the life of the device was increased by a factor of about 5 as compared with those of a buried type laser device using an $In_{0.52}Ga_{0.11}Al_{0.21}As$ strained quantum well layer (amount of strain: +1.0%, film thickness: 8 nm). In addition, the threshold current value was reduced by about 40% relative to that of a ridge stripe type laser using an active layer with the same material. The life of a device was evaluated from the time for the working current of a laser to increase by 50%. As a result, the InGaAlAs-besed laser also was capable of realizing a long-term reliability of 100 thousands hours equivalent to that of the InGaAsP-besed laser. Furthermore, a decrease in the threshold current value due to the buried type structure shows that the current constriction in the lateral direction sufficiently works. On the other hand, a decrease in the threshold current value due to the Al composition ratio reduction of the well layer shows the defect reduction of the regrowth interface, i.e., shows that a high quality regrowth interface is obtained.

EXAMPLE 2

Figure 9:
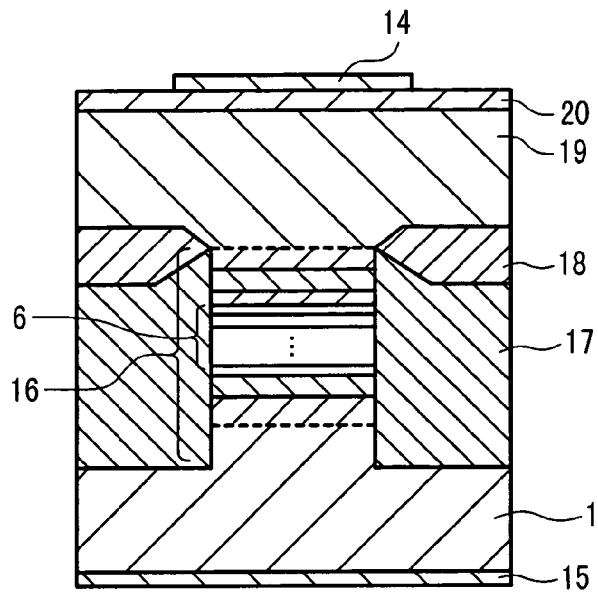
FIG. 9 is a sectional view in a face where a semiconductor laser device of a second example of the present invention and the advancing direction of laser light are intersected.

FIG. 9 shows an example of an InP buried type semiconductor laser device using a buried layer with a p-n junction, and, similar to FIG. 8, is a sectional view in a face where the device and the advancing direction of laser light are intersected.

As in the case of the example above, the layers until the p-InP clad layer 9 was grown on the n-InP substrate 1, and then a mesa-stripe 16 was formed. Subsequently, a p-InP buried layer 17 (film thickness: 800 nm, Zn concentration: $8\times10^{17}$ cm$^{-3}$) and an n-InP buried layer 18 (film thickness: 400 nm, Si concentration: $2\times10^{18}$ cm$^{-3}$) were formed. Furthermore, after a p-InP clad layer 19 and a p-InGaAs contact layer 20 were formed, a laser structure using steps similar to those for Example 1 was constructed.

For the present example, a current flows through the p-InP layer and a current is blocked with the p/n/p junction of the buried layer, and so the buried interface and crystal properties of the buried layer have a profound effect on a long-term reliability. Because of this, in the present example, the threshold current value of the laser was capable of being reduced by about 40% and the life of the device increased 10 times, as compared to those of a buried type laser device using an $In_{0.68}Ga_{0.11}Al_{0.21}As$ strained quantum well layer (amount of strain: +1.0%, film thickness: 8 nm).

EXAMPLE 3

Figure 10:
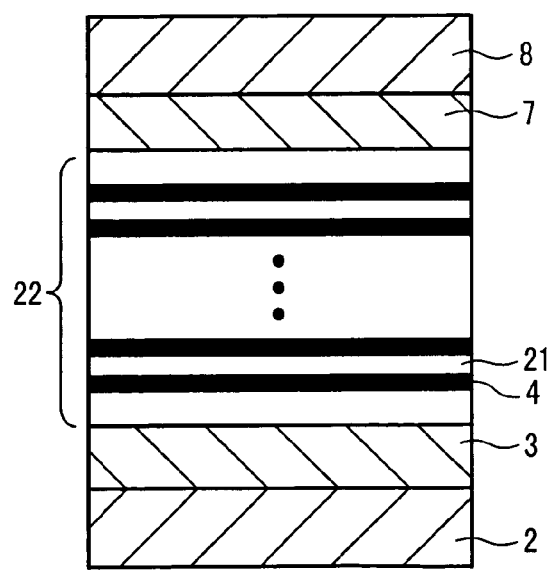
FIG. 10 is a sectional view in a face where a semiconductor laser device of a third example of the present invention and the advancing direction of laser light are intersected.

The present example is an example in which the invention was applied to a p-type modulation doped multiple-quantum well structure. FIG. 10 is a sectional view in a face where the modulation doped multiple-quantum well structure and the advancing direction of laser light are intersected.

By means of a metalorganic vapor phase epitaxy method, an n-InP buffer layer 2 (Si concentration: $1 \times 10^{18}$ cm$^{-3}$, film thickness: 500 nm) and an n-In$_{0.52}$Ga$_{0.08}$Al$_{0.40}$As guide layer 3 (film thickness: 80 nm, lattice-matched with an InP substrate, wavelength: 920 nm, Si concentration: $1 \times 10^{18}$ cm$^{-3}$) were grown on an n-InP substrate 1. Then a strained quantum well structure 22 (9 periods), an undoped In$_{0.52}$Ga$_{0.08}$Al$_{0.40}$As guide layer 7 (film thickness: 80 nm, lattice-matched with the InP substrate, wavelength: 920 nm) were grown, and subsequently a laser structure was fabricated by steps similar to those in the case of Example 1 above. In addition, the strained quantum well structure 22 is comprised of an undoped In$_{0.38}$Ga$_{0.56}$Al$_{0.06}$As strained quantum well 4 (amount of strain: −1.0%, film thickness: 8 nm), and a Zn doped In$_{0.52}$Ga$_{0.16}$Al$_{0.32}$As barrier layer 21 (film thickness: 10 nm, lattice-matched with the InP substrate, wavelength: 1000 nm, Zn concentration: $5 \times 10^{18}$ cm$^{-3}$).

As the effects of the present invention, the threshold current value of the resultant laser and the reliability of the device were similar to the effects of Example 1 as compared with those of a buried type laser device using an In$_{0.68}$Ga$_{0.11}$Al$_{0.21}$As strained quantum well layer (amount of strain: +1.0%, film thickness: 8 nm). In addition, in the tensile strain of the present invention, the effect of the p-type modulation doping was very large as compared to conventional compressive strains and non-strains. As a result, in a buried type laser device using an In$_{0.68}$Ga$_{0.11}$Al$_{0.21}$As strained quantum well layer (amount of strain: +1.0%, film thickness: 8 nm), the resonant frequency (the resonant frequency being proportional to the square root of the differential gain) was increased only by about 30% even though the structure was changed into a p-type modulation doped structure. However, in the In$_{0.38}$Ga$_{0.56}$Al$_{0.06}$As strained quantum well layer 4 (amount of strain: −1.0%, film thickness: 8 nm), the resonant frequency was capable of being increased by 50%. Because of this, the high speed direct modulation laser device was realized. Table 3 tabulates the properties for comparison to support the effects described above. In other words, Table 3 shows comparisons of tensile strains, compressive strains and no strains of quantum well layers. Furthermore, the differential gains are indicated for the multiple-quantum well structure being undoped or being p-type modulation doped. The table shows that the properties are best in the case of the tensile strain of the present invention.

TABLE 3

| Amount of strain | Differential gain (cm$^2$) | | |
|---|---|---|---|
| | Undoped | p-type modulation doped | |
| −1.20% | $1 \times 10^{15}$ | $2.3 \times 10^{15}$ | present invention |
| 0% | $0.45 \times 10^{15}$ | $0.86 \times 10^{15}$ | comparative Example |
| +1.2% | $0.9 \times 10^{15}$ | $1.5 \times 10^{15}$ | comparative Example |

Additionally, in the amount of p-type doping the range of $2 \times 10^{18}$ cm$^{-3}$ to $1 \times 10^{19}$ cm$^{-3}$ was frequently used. In the example above Zn was used as a p-type dopant, but other p-type dopants such as carbon (C) and beryllium (Be) may be used. Furthermore, in the relations between the concentration and the kind of dopants and InGaAlAs layers, it is desirable that a dopant at a high concentration be not prone to diffusion wherever possible.

EXAMPLE 4

The present example is one of the present invention concerning a semiconductor optical device in which the photoluminescence wavelength of the active layer is from 1.36 μm to 1.49 μm. This example is useful for being applied to a pumping light source for Raman amplifiers and a pumping light source at 1.48 μm for fiber amplifiers.

The laser structure was fabricated by steps similar to those of Example 2 except the selection of the quantum well layer composition. For mounting, the device was amounted on a SiC heat sink, with the p electrode side down, to make heat emission good at a high output.

As described with reference to FIG. 6, in the composition diagram of the In$_{1-x-y}$Ga$_x$Al$_y$As quantum well layer, a composition for securing photoluminescence in the wavelength range above with an Al composition ratio of 0.13 or less is such that the composition ratios are within the range of O (In: 0.76, Ga: 0.11, Al: 0.13), P (In: 0.5, Ga: 0.5, Al: 0), Q (In: 0.34, Ga: 0.66, Al: 0), and R (In: 0.55, Ga: 0.32, Al: 0.13). In addition, in the 1.36 to 1.49 μm bands InGaAs is possible as well, but the optimization of the laser structure is difficult because the amount of strain and the film thickness cannot be controlled independently in the case of InGaAs. Therefore, InGaAlAs containing Al is desirable as the composition of the well layer.

The reliability of a semiconductor laser device is decreased with increasing output power, and in the present example the device life at a high output (e.g., 300 mW) was increased by 20 times or more, as compared to that of a buried type laser device using a strained quantum well layer (amount of strain: +1.0%, film thickness: 8 nm) of In$_{0.73}$Ga$_{0.08}$Al$_{0.19}$As.

In addition, Examples 1 to 4 above are examples of a monolithic laser structure, and is applicable to an array-like laser structure. Also, the examples are those of a laser structure placed on an n-InP substrate, and a laser structure on a p-InP substrate is acceptable as well. Furthermore, the compositions of the InGaAlAs barrier layer and the guide layer are such that the composition wavelength is 1000 nm, and other compositions is also acceptable. An InGaAsP layer, as required, is usable as well. The film thicknesses of the well layers all are also 8 nm in the present examples, and if the thickness is from 4 nm to 10 nm, other film thicknesses are also acceptable from the viewpoint of device properties. Although a process for growing a crystal in the multiple-layer structure utilizes a metalorganic vapor phase epitaxy method, other processes for growing thin films, including a molecular beam epitaxy method and a chemical beam epitaxy method, are suitable as well. On the other hand, for a growing process of a buried structure, a metalorganic vapor phase epitaxy method is desirable because the epitaxy has the ease of selective growth as compared to other processes for growing crystals, and because oxidized film is apt to scatter due to a high optimum growth temperature.

EXAMPLE 5

Figure 11:
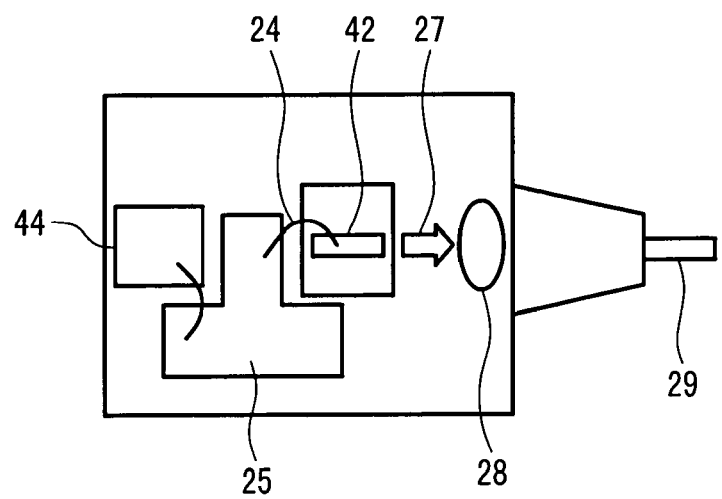
FIG. 11 is a schematic plan view of a module indicating a fifth example of the present invention.
Figure 12:
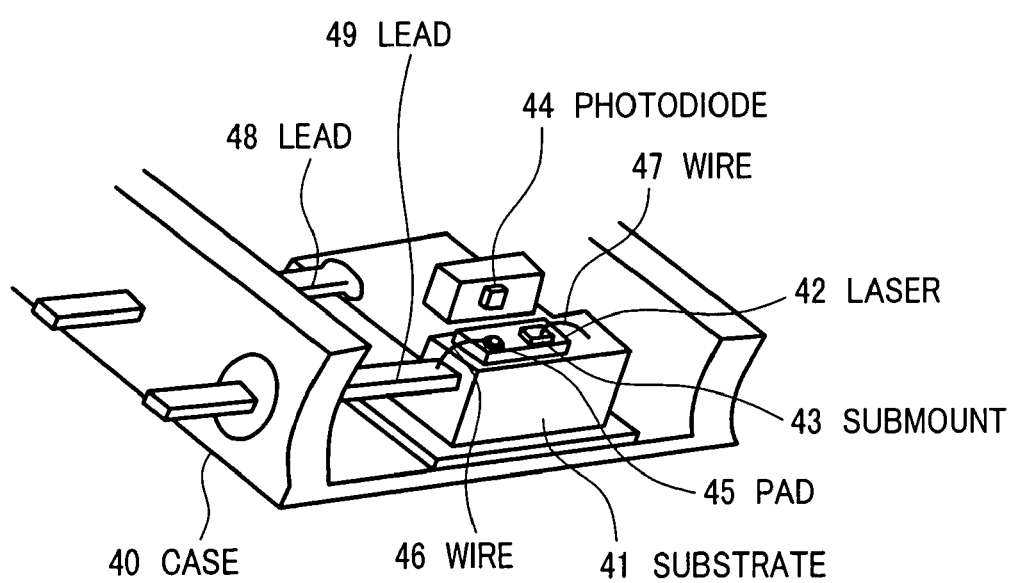
FIG. 12 is a perspective view of a module indicating the fifth example of the present invention.

The present example explains an example of an optical module. FIG. 11 is a schematic view when a semiconductor optical device of the present invention was used in on an optical module. FIG. 12 is a perspective view of the mounted portion. A case 40 of the optical module accommodates an InGaAlAs-based semiconductor laser device 42 relating to the present invention. The semiconductor laser device 42 is mounted on a submount 43, which is placed on a substrate 41 for mounting a specified laser. In this example, an electrode of the semiconductor laser device 42 is connected to a lead 49 via a wire 46 from a pad 45, and the other electrode connected to via a wire 47 to the substrate 41 for mounting a laser. The lead 49 is projected outside the case 40. On the other hand, the substrate 41 for mounting a laser is connected to a lead 48 and projected outside the case 40. As can be seen in the example, use of an InGaAlAs-based semiconductor laser device concerning the present invention enables optical modulation for optical communication at room temperature without utilizing a thermoelectric cooler such as a Peltier device.

When mounted to the module in FIG. 11, the buried type semiconductor laser device 42 of the present invention is operated by means of a driving circuit 25 through a wire 24. An optical output is adjusted by causing a signal at a photo diode 44 for monitoring on the back stage to feedback to the driving circuit 25. Signal light 27 is focused on an optical fiber 29 through a lens 28.

An advantage using an InGaAlAs-based buried type semiconductor laser device of the present invention has little deterioration of laser properties at high temperature as compared to an InGaAsP-based buried type semiconductor laser, and therefore a function of adjusting temperature using a Peltier device does not need to be placed. In addition, for a device of the present invention, the active layer is buried in the semiconductor in contrast to a ridge type semiconductor laser, and so the device has a small effect of a high temperature and a high humidity of device properties, thereby leading to no need of hermetic sealing.

Additionally, Examples 1 to 5 are ones of semiconductor laser devices and optical modules using the semiconductor devices. Modules using the optical modulator of the above-described wavelength range and the optical switches and the optical devices thereof as well can be fabricated in the InGaAlAs system, and have similar effects. Furthermore, the reference numerals in the figures of the present invention stand for the following:

1: n-InP substrate
2: n-InP buffer layer
3: n-InGaAlAs guide layer
4: undoped InGaAlAs strained quantum well layer
5: undoped InGaAlAs barrier layer
6: strained quantum well structure
7: undoped InGaAlAs guide layer
8: p-InAlAs clad layer
9: p-InP clad layer
10: p-InP clad layer
11: p-InGaAs contact layer
12: mesa-stripe
13: Fe-doped InP high-resistant layer
14: p-side electrode
15: n-side electrode
16: mesa-stripe
17: p-InP buried layer
18: n-InP buried layer
19: p-InP clad layer
20: p-InGaAs contact layer
21: Zn-doped InGaAlAs barrier layer
22: strained quantum well structure
23: buried type semiconductor laser
24: wire
25: driving circuit

What is claimed is:

1. A semiconductor optical device, comprising:
an InP substrate;
an active region formed above the InP substrate, said active region being comprised of a quantum well structure;
optical guiding layers each formed on and under said active region; and
clad layers;
wherein on sides in the direction crossing the light-emitting direction, the sides of the active region are buried with semiconductor layers having band gap energy greater than that of a quantum well layer; and
wherein a composition of Al of the quantum well layer is in the group consisting of InGaAlAs compound semiconductor layers, a composition ratio of the Al being in the range of 0 to 0.13, both inclusive, wherein
the InGaAlAs is in the group consisting of compositions A (In: 0.87, Ga: 0, Al: 0.13), B (In: 1.0, Ga: 0, Al: 0), C (In: 0, Ga: 1.0, Al: 0), and D (In: 0, Ga: 0.87, Al: 0.13) in the composition diagram of the four-element based compound semiconductor materials ($In_{1-x-y}Ga_xAl_yAs$).

2. A semiconductor optical device, comprising:
an InP substrate;
an active region formed above the InP substrate, said active region being comprised of a quantum well structure;
optical guiding layers each formed on and under said active region; and
clad layers;
wherein on sides in the direction crossing the light-emitting direction, the sides of the active region are buried with semiconductor layers having band gap energy greater than that of a quantum well layer;
wherein the composition ($In_{1-x-y}Ga_xAl_yAs$) of the quantum well layer is in the group consisting of compositions E (In: 0.52, Ga: 0, Al: 0.48), F (In: 0.53, Ga: 0.47, Al: 0), C (In: 0, Ga: 1.0, Al: 0), and G (In: 0, Ga: 0, Al: 1.0) in the composition diagram of the four-element based compound semiconductor materials; and
wherein the quantum well layer has tensile strain.

3. A semiconductor optical device, comprising:
an InP substrate;
an active region formed above the InP substrate, said active region being comprised of a quantum well structure;
optical guiding layers each formed on and under said active region; and
clad layers;
wherein on sides in the direction crossing the light-emitting direction, the sides of the active region are buried with semiconductor layers having band gap energy greater than that of a quantum well layer; and
wherein a composition of Al of the quantum well layer is in the group consisting of InGaAlAs compound semiconductor layers, a composition ratio of the Al being in the range of 0 to 0.13. both inclusive, wherein
the InGaAlAs layer is in the group consisting of compositions H (In: 0.53, Ga: 0.34, Al: 0.13), F (In: 0.53, Ga: 0.47, Al: 0), C (In: 0, Ga: 1.0, Al: 0), and D (In: 0, Ga: 0.87, Al: 0.13) in the composition diagram of the four-element based compound semiconductor materials ($In_{1-x-y}Ga_xAl_yAs$), and has tensile strain.

4. The semiconductor optical device according to claim 3, wherein
the photoluminescence wavelength from the active region is within the range of 1.25 μm to 1.35 μm.

5. The semiconductor optical device according to claim 4, wherein
a barrier layer constituting the active region is p-type doped.

6. A semiconductor optical device, comprising:
an InP substrate;
an active region formed above the InP substrate, said active region being comprised of a quantum well structure;
optical guiding layers each formed on and under said active region; and
clad layers;
wherein on sides in the direction crossing the light-emitting direction, the sides of the active region are buried with semiconductor layers having band gap energy greater than that of a quantum well layer; and
wherein a composition of Al of the quantum well layer is in the group consisting of InGaAlAs compound semiconductor layers, a composition ratio of the Al being in the range of 0 to 0.13. both inclusive, wherein
the InGaAlAs layer is in the group consisting of compositions H (In: 0.53, Ga: 0.34, Al: 0.13), I (In: 0.53, Ga: 0.4, Al: 0.07), J (In: 0.4, Ga: 0.6, Al: 0), K (In: 0. 26, Ga: 0.74, Al: 0) and L (In: 0.46, Ga: 0.41, Al: 0.13) in the composition diagram of the four-element based compound semiconductor materials ($In_{1-x-y}Ga_xAl_yAs$); and has tensile strain.

7. The semiconductor optical device according to claim 6, wherein
a barrier layer constituting the active region is p-type doped.

8. A semiconductor optical device, comprising:
an InP substrate;
an active region formed above the InP substrate, said active region being comprised of a quantum well structure;
optical guiding layers each formed on and under said active region; and
clad layers;
wherein on sides in the direction crossing the light-emitting direction, the sides of the active region are buried with semiconductor layers having band gap energy greater than that of a quantum well layer; and
wherein a composition of Al of the quantum well layer is in the group consisting of InGaAlAs compound semiconductor layers, a composition ratio of the Al being in the range of 0 to 0.13. both inclusive,
wherein the photoluminescence wavelength from the active region is within the range of 1.25 μm to 1.35 μm; and
wherein the InGaAlAs layer is in the group consisting of compositions H (In: 0.53, Ga: 0.34, Al: 0.13), I (In: 0.53, Ga: 0.4, Al: 0.07), J (In: 0.4, Ga: 0.6, Al: 0K (In: 0.26, Ga: 0.74, Al: 0) and L (In: 0.46, Ga: 0.41, Al: 0.13) in the composition diagram of the four-element based compound semiconductor materials ($In_{1-x-y}Ga_xAl_yAs$).

9. The semiconductor optical device according to claim 8, wherein
a barrier layer constituting the active region is p-type doped.

10. A semiconductor optical device, comprising:
an InP substrate;
an active region formed above the InP substrate, said active region being comprised of a quantum well structure;
optical guiding layers each formed on and under said active region; and
clad layers;
wherein on sides in the direction crossing the light-emitting direction, the sides of the active region are buried with semiconductor layers having band gap energy greater than that of a quantum well layer; and
wherein a composition of Al of the quantum well layer is in the group consisting of InGaAlAs compound semiconductor layers, a composition ratio of the Al being in the range of 0 to 0.13. both inclusive, wherein
the InGaAlAs layer is in the group consisting of compositions O (In: 0.76, Ga: 0.11, Al: 0.13), P (In: 0.5, Ga: 0.5, Al: 0), Q (In: 0.34, Ga: 0.66, Al: 0), and R (In: 0.55, Ga: 0.32, Al: 0.13) in the composition diagram of the four-element based compound semiconductor materials ($In_{1-x-y}Ga_xAl_yAs$).

11. The semiconductor optical device according to claim 10, wherein
a barrier layer constituting the active region is p-type doped.

12. A semiconductor optical device, comprising:
an InP substrate;
an active region formed above the InP substrate, said active region being comprised of a quantum well structure;
optical guiding layers each formed on and under said active region; and
clad layers;
wherein on sides in the direction crossing the light-emitting direction, the sides of the active region are buried with semiconductor layers having band gap energy greater than that of a quantum well layer; and
wherein a composition of Al of the quantum well layer is in the group consisting of InGaAlAs compound semiconductor layers, a composition ratio of the Al being in the range of 0 to 0.13. both inclusive,
wherein the InGaAlAs layer is in the group consisting of the compositions O (In: 0.76, Ga: 0.11, Al: 0.13), P (In: 0.5, Ga: 0.5, Al: 0), Q (In: 0.34, Ga: 0.66, Al: 0), and R (In: 0.55, Ga: 0.32, Al: 0.13) in the composition diagram of the four-element based compound semiconductor materials ($In_{1-x-y}Ga_xAl_yAs$); and
wherein the photoluminescence wavelength from the active region is within the range of 1.36 μm to 1.49 μm.

13. The semiconductor optical device according to claim 12, wherein
a barrier layer constituting the active region is p-type doped.

14. An optical module at least including a package substrate and a semiconductor optical device mounted on the package substrate,
wherein said semiconductor optical device is a semiconductor optical device, comprising: an InP substrate; an active region formed above the InP substrate, said active region being comprised of a quantum well structure; optical guiding layers each formed on and under said active region; and clad layers,
wherein on sides in the direction crossing the light-emitting direction, the sides of the active region areburied with semiconductor layers having band gap energy greater than that of a quantum well layer, and wherein a composition of Al of the quantum well layer is in the group consisting of InGaAlAs compound semiconductor layers, a composition ratio of the Al being in the range of 0 to 0.13. both inclusive, wherein the sealing structure of the optical module is of non-hermitic sealing; and wherein the semiconductor optical device is at least mounted on the package substrate without using a temperature controller.

* * * * *